United States Patent [19]

Bradford

[11] Patent Number: 4,966,280

[45] Date of Patent: Oct. 30, 1990

[54] MULTIPLE-PLY ANTI-STATIC PAPERBOARD

[75] Inventor: Judson A. Bradford, Holland, Mich.

[73] Assignee: Bradford Company, Holland, Mich.

[21] Appl. No.: 336,733

[22] Filed: Apr. 12, 1989

Related U.S. Application Data

[63] Continuation-in-part of Ser. No. 190,044, May 4, 1988.

[51] Int. Cl.$^5$ .............................................. B65D 81/00
[52] U.S. Cl. ..................................... 206/328; 493/906; 53/170
[58] Field of Search ..................... 206/328, 524.1, 205; 428/922, 924, 408; 156/324, 244.11; 53/170, 172, 472; 493/906

[56] References Cited

U.S. PATENT DOCUMENTS

| | | | |
|---|---|---|---|
| 3,877,571 | 4/1975 | Sanford | 206/183 |
| 4,154,344 | 5/1979 | Yenni, Jr. et al. | 206/328 |
| 4,156,751 | 5/1979 | Yenni, Jr. et al. | 206/332 |
| 4,293,070 | 10/1981 | Ohlbach | 206/328 |
| 4,424,900 | 1/1984 | Petcavich | 206/328 |
| 4,482,048 | 11/1984 | Blodgett | 206/328 |
| 4,496,406 | 1/1985 | Dedow | 206/328 |
| 4,528,222 | 7/1985 | Rzepecki et al. | 206/328 |
| 4,553,190 | 11/1985 | Mueller | 206/328 |
| 4,610,353 | 9/1986 | Young | 206/328 |
| 4,623,594 | 11/1986 | Keough | 428/413 |
| 4,647,714 | 3/1987 | Goto | 206/328 |
| 4,658,958 | 4/1987 | McNulty et al. | 206/328 |
| 4,677,809 | 7/1987 | Long et al. | 206/328 |
| 4,684,020 | 8/1987 | Ohlbach | 206/328 |
| 4,685,563 | 8/1987 | Cohen et al. | 206/328 |
| 4,699,830 | 10/1987 | White | 206/328 |
| 4,707,414 | 11/1987 | Long et al. | 206/328 |
| 4,711,702 | 12/1987 | Hood | 206/328 |
| 4,712,674 | 12/1987 | Young | 206/328 |
| 4,756,414 | 7/1988 | Mott | 206/328 |
| 4,773,534 | 9/1988 | Detteras et al. | 206/328 |
| 4,792,042 | 12/1988 | Koehn et al. | 206/328 |

FOREIGN PATENT DOCUMENTS

| | | | |
|---|---|---|---|
| 2516293 | 5/1983 | France | 206/328 |
| 0023159 | 2/1985 | Japan | 206/524.1 |
| 0071800 | 4/1985 | Japan | 206/524.1 |
| 0081400 | 5/1985 | Japan | 206/524.1 |
| 2041241 | 1/1987 | Japan | 206/328 |
| 2131382 | 6/1984 | United Kingdom | 206/524.1 |

OTHER PUBLICATIONS

Packaging Engineering, vol. 28, #1, pp. 104–107, "Transparent Bags Foil Static Electricity's 'Zap'".

Primary Examiner—Paul T. Sewell
Assistant Examiner—Jacob K. Ackun, Jr.
Attorney, Agent, or Firm—Wood, Herron & Evans

[57] ABSTRACT

A multiple-ply anti-static paperboard having a layer of high-carbon content fiberboard sandwiched between two plies of anti-static material, the anti-static material being an anti-static plastic or low-carbon content paperboard. Dividers and pads made of such multiple-ply paperboard are used to form a plurality of walled cells within a container, each of the cells completely enclosing a packaged article susceptible to electrostatic discharge. The conductive layer forms a Faraday cage to electrostatically shield the packaged article, and the anti-static layer prevents conductive dust from contacting and adversely affecting the packaged article, as well as protecting the packaged article against the generation of static electricity internally of the container.

21 Claims, 2 Drawing Sheets

MULTIPLE-PLY ANTI-STATIC PAPERBOARD

This application is a Continuation-in-Part Application of U.S. Pat. Application Ser. No. 07/190,044 filed May 4, 1988 and assigned to the assignee of this application.

This invention relates to a multiple-ply anti-static paperboard particularly useful for packaging articles adversely affected by electrostatic discharge.

BACKGROUND OF THE INVENTION

Static discharge is a naturally occurring electronic phenomenon. Triboelectric charge, often referred to as static electricity, builds up in all materials to some degree, and is eventually discharged as the charge traverses a path toward an electrical ground. Static electricity buildup is strongest in insulative materials.

Circuit boards contain microcircuitry which can be easily damaged by electrostatic discharge of relatively small magnitude. Magnitudes as small as 50 volts can permanently damage these devices. For comparative purposes, to illustrate the extreme sensitivity of microcircuits to this phenomenon, a visible charge from a human hand to a door knob in winter will often exceed 10,000 volts. Thus, extreme caution must be taken in protecting such microcircuit components from electrostatic discharge.

To provide protection from electrostatic discharge for packaged articles, a principle of physics referred to as the Faraday cage effect is employed. Electricity does not penetrate a conductive enclosure. The static electric charge will go around the enclosed space, seeking the path of least electrical resistance en route to ground. By surrounding a static sensitive article with a conductive enclosure, the article is shielded from electrostatic discharge originating outside of the enclosure.

Packaging is considered to be in the conductive range if it has a measurable surface resistivity of less than $10^5$ ohms per square inch. U.S. Pat. No. 4,610,353 to Young discloses a three-ply corrugated board used to form a container wherein each ply of the board has sufficient carbon embedded therein to make that ply electrically conductive, thus providing a Faraday cage to shield a packaged article from electrostatic discharge.

However, the use of such a conductive enclosure for packaging an electrostatic sensitive article presents other disadvantages. Conductive materials of this type can slough to create a dust, or particulate, of conductive material. Some amount of sloughing or spalling of conductive dust will inevitably occur, but the incidence of its occurrence is greatly increased if the article to be packaged contacts a wall of the cell as it is placed therein, as is often the case when packaging a microcircuit component. When a conductive particle contacts a microelectronic component, the particle can form an undesired short circuit or a misdirected pathway, thus shunting the electrical charge and resulting in temporary or permanent damage. Therefore, while it is desirable to provide a conductive enclosure to shield microcircuits from electrostatic discharge, it is also necessary that the packaged article be shielded from sloughing of particulate conductive material.

Attempts have been made to limit the effects of conductive spall. U.S. Pat. No. 4,482,048 to Blodgett discloses a divider used in packaging which is made from corrugated board having a conductive layer of material laminated between two outer webs. The inner conductive layer shields the packaged article from electrostatic discharge while the outer corrugated board webs prevent conductive particulate matter from spalling and contacting electrical circuitry.

Although the web residing nearest to the packaged article of the Blodgett patent effectively blocks the packaged article from conductive spall which originates from the interior conductive layer, electrostatic discharge protection is compromised with this structure because this corrugated board web is presumably a paperboard web and paperboard is an insulator. One of the best generators of static electricity is movement of an electrical conductor, such as an electrical circuit of a circuit board, over an insulator, such as a paperboard web. The disposition of an insulative layer between the conductive layer and the packaged article of the Blodgett patent therefore creates a static electricity generator in direct contact with the electrical circuit board or compound which the Blodgett patent is attempting to protect from undesirable contact with static electricity.

There are other inherent disadvantages associated with the use of corrugated board for packaging articles in the manner of the Blodgett patent. Although the fluted layer common to all corrugated board provides rigidity to physically protect the packaged article, the physical protection afforded can be far greater than what is actually needed, especially in light of the fact that the fluted layer creates a void or empty space which is not used. These voids take up shipping volume, resulting in increased handling expenses. Due to the flutes, corrugated board is also difficult to cut cleanly. The knife tends to direct the flutes in an undesired direction. Additionally, the outer webs of corrugated board tend to be abrasive, which can result in physical harm to the article during packaging. Lastly, corrugated board is typically Kraft paper colored, thus conveying the presumption that it is disposable, regardless of whether or not its useful life has expired. Inadvertent disposal of more expensive reusable packaging material is wasteful and can drive up the expense of packaging.

Anti-static, or dissipative, materials are defined as materials which do not generate a triboelectric charge. Anti-static materials generally have a surface resistivity of from $10^9$ to $10^{14}$ ohms per square inch. Anti-static materials might be considered static neutral. While an anti-static enclosure will not cause electrostatic discharge (ESD), an anti-static enclosure does not, by itself, provide static shielding either.

Because anti-static materials do not conduct a static charge, they can be used for cushioning or wrapping static sensitive articles before they are placed within conductive enclosures, thus providing protection against conductive spall. U.S. Pat. No. 4,658,958 to McNulty discloses a bag having two plies of anti-static (polyethylene) material and an electrically conductive fabric or mat embedded therebetween to provide a shield from electrostatic discharge for a bagged article.

Although the McNulty bag may prove effective in protecting a bagged article from electrostatic discharge, it does not, by itself, provide the adequate rigidity for physical protection of a microcircuit component. In order to provide physical protection, the bagged article must be placed within another cell in a container. This results in additional material and material handling costs, requiring a bag enclosure, additional labor costs associated with bagging and additional shipping costs due to reduced packaging density. Reduced packaging density is due to the fact that each cell must hold an article within a bag, rather than just the article itself. Thus, for a container having a given volume, use of bag packaging will necessitate larger sized cells resulting in the packaging of fewer articles per container.

In addition to providing electrostatic and physical protection, a container for packaging microcircuit components should also provide protection from chemical corrosion. Due to availability and relative cost, paper products are often used to form packaging containers for shipping articles. In the paper making process, caustic chemicals such as sulfur are added to the slurry in order to split out or soften wood fibers. Subsequently, after a container has been formed from the paper, sulfur dioxide and other corrosive gases trapped within the paper can escape to react with water in the air, eventually condensing upon the packaged article with a slight change in temperature. This condensation can corrode the article. In effect, a very minor scale acid rain takes place within the paper container. In order to chemically protect a microcircuit component, the sulfur must either be physically blocked or chemically bonded to another substance.

It is therefore an object of this invention to provide a conductive enclosure which adequately shields electrostatic sensitive articles from static electric discharge.

It is another object of the invention to provide an anti-static packaging enclosure which effectively prevents the adverse effects of conductive spall.

It is a still further object of this invention to provide a rigid enclosure for physically protecting an electrostatic sensitive article, which at the same time both shields the packaged article from static electricity and prevents the adverse effects of conductive spall.

It is still another object of the invention to provide a cost effective container which effectively protects a packaged article from electrostatic, physical and chemical damage.

SUMMARY OF THE INVENTION

To these ends, a multiple-ply anti-static paperboard is disclosed. Dividers and pads made of this multiple-ply anti-static, or static dissipative, paperboard are fitted into a corrugated container to provide a plurality of completely enclosed, walled packaging cells. Each wall comprises a layer of high-carbon content paperboard sandwiched between two layers of anti-static material. The interior ply of high-carbon content paperboard is electrically conductive, having a surface resistivity lower than $10^5$ ohms per square inch. The exterior, anti-static layers have a surface resistivity of from $10^9$ to $10^{14}$ ohms per square inch.

In one embodiment, the sandwiching outer layers are low-density polyethylene which has been doped with a chemical anti-static additive.

In another and preferred embodiment, the sandwiching outer plies are low-density polyethylene film which has been chemically coated and subjected to high-energy, electron beam radiation.

And in a third embodiment, the sandwiching outer layers comprise plies of low-carbon content, anti-static fiberboard.

This multiple-ply packaging material provides an interior, electrically conductive layer to shield the packaged article from electrostatic discharge, while at the same time the exterior antistatic layers protect the packaged article from conductive spall.

In forming the interior ply of the multiple-ply anti-static paperboard of this invention, carbon particles are mixed into a slurry during the blending of the paper forming process, thereby to obtain a high-carbon content, conductive fiberboard. The carbon particles are admixed in sufficient quantity to provide a layer of board having a surface resistivity of less than $10^5$ ohms per square inch. The high-carbon content interior ply is sandwiched between two outer layers of anti-static material.

In forming the outer layers, low-density polyethylene that has been treated so as to be antistatic may be extruded onto the top and bottom surfaces of the high-carbon content paperboard or may be laminated onto the top and bottom surfaces of the high-carbon content paperboard. Although other low-density plastics may be used, polyethylene is preferred due to its availability and relatively low cost. Alternatively, the exterior plies may be of low-carbon content paperboard which are layered prior to and subsequent to the formation of the high-carbon layer in a typical multiple-ply paperboard-making process, thus sandwiching the high-carbon content layer between two plies of anti-static paperboard. In this alternative process, the paperboard slurry that will be used to form the exterior plies is mixed with carbon particles in sufficient quantity to provide a surface resistivity of from $10^9$ to $10^{14}$ ohms per square inch.

In the currently preferred embodiment, precast anti-static plastic film is laminated onto both sides of a high-carbon content, conductive paperboard. The preferred precast anti-static plastic film is a low-density polyethylene film which has been chemically coated and then subjected to high-energy, electron-beam radiation. This precast film is laminated to the high-carbon content paperboard by layering the precast film over the paperboard while the paperboard is coated with a thin coating of molten polyethylene. Upon solidification of the molten polyethylene, the precast film is permanently laminated to the high-carbon content paperboard.

In forming the outer layers for all embodiments described hereinabove, a corrosion inhibitor may be added to protect the packaged article from chemical corrosion. To provide chemical protection, the added corrosion inhibitor evaporates off of the outer ply and attaches itself to the packaged article, thereby shielding the article from the sulfuric compounds.

The multiple-ply anti-static paperboard of this invention is symmetric about the interior ply, resulting in an efficient use of space within a paperboard container. An article packaged on either side of a wall formed of this material is equally protected from both static discharge and from conductive dust. Additionally, the interior paperboard ply provides sufficient rigidity to physically protect a packaged article without requiring repackaging within another cell, as required by bag packaging.

Other objects and advantages of the invention will become apparent upon reading the following detailed description and upon reference to the drawings, in which:

DETAILED DESCRIPTION OF THE INVENTION

Figure 1:
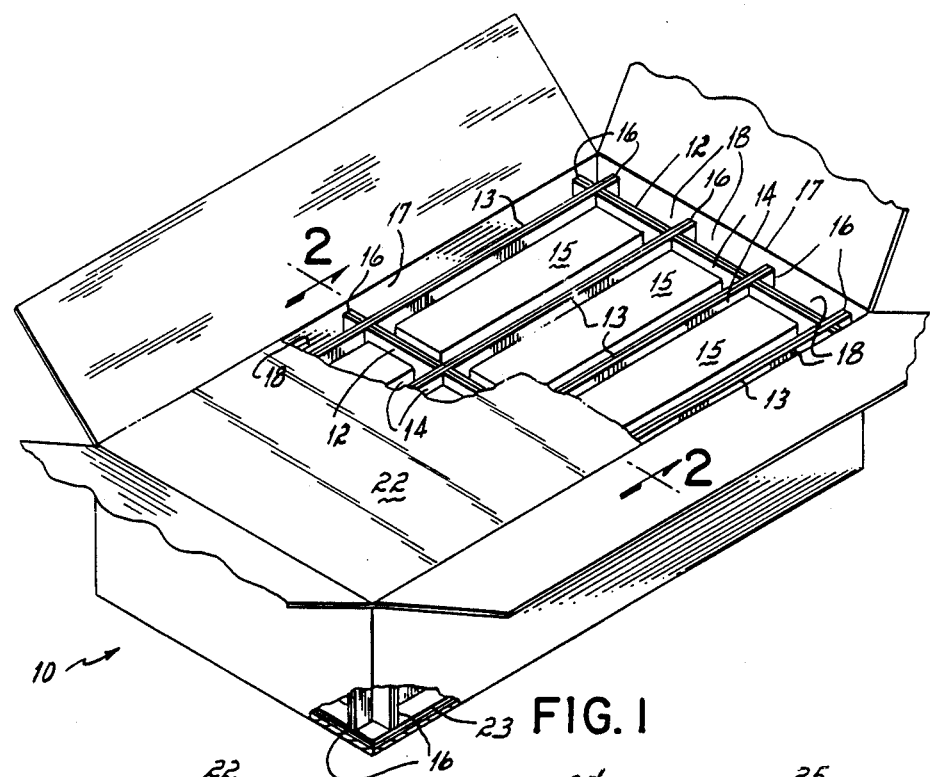
FIG. 1 is a perspective view of a corrugated container, with a plurality of packaging cells partially defined therein by transverse and longitudinal dividers of the multiple-ply anti-static paperboard of this invention.

FIG. 1 shows a container 10 which is fitted therein with transverse dividers or partitions 12 and longitudinal dividers or partitions 13 which define the side walls of a plurality of cells 14. Each cell 14 is designed to hold an article 15 to be shipped. Both the transverse dividers 12 and the longitudinal dividers 13 have some excess portion 16 which extends beyond an adjacent cell 14 and into contact with side panels 17 of the container 10, thereby defining a plurality of voids 18 or empty spaces which remain unused. As known in the container industry, the transverse dividers 12 have vertically, downwardly extending slits, and the longitudinal dividers 13 have corresponding vertically, upwardly extending slits, to enable interfitting of the dividers within the container 10 to partially define the cells 14. Alternately, the vertical slits in the transverse divider 12 may be upwardly extending and the vertical slits in the longitudinal dividers 13 may extend downwardly.

Figure 2:
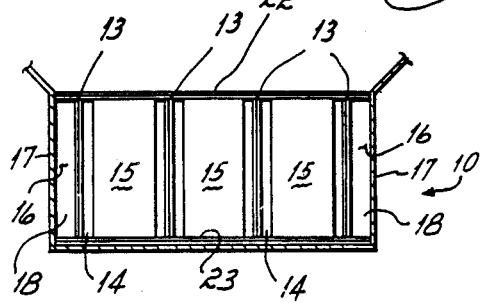
FIG. 2 is a cross-sectional view taken on lines 2—2 of FIG. 1.
Figure 5:
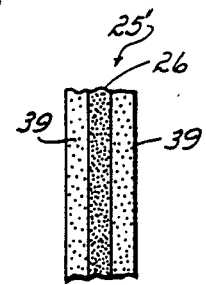
FIG. 5 is a cross-sectional view of an alternative embodiment of the multiple-ply anti-static paperboard of this invention.

As shown in FIG. 2, a lower pad 23 resides beneath the dividers, and an upper pad 22 overlays the dividers to completely enclose the cells 14. According to the invention, the transverse dividers 12, the longitudinal dividers 13, and the top 22 and bottom 23 pads are comprised of a multiple-ply anti-static paperboard 25, which is shown in FIGS. 3 and 5.

Figure 3:
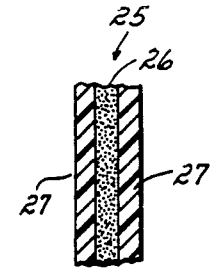
FIG. 3 is a cross-sectional view of one embodiment of a multiple-ply anti-static paperboard of this invention.
Figure 6:
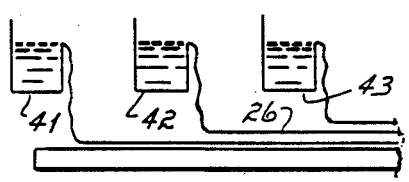
FIG. 6 is a schematic illustration of a method of forming the paperboard of FIG. 5.

The multi-ply anti-static paperboard 25 comprises a layer of high-carbon content fiberboard 26 which is preferably sandwiched between two layers of low-density, anti-static polyethylene 27, as shown in FIG. 3. The interior paperboard ply 26 is electrically conductive, having a surface resistivity of less than $10^5$ ohms per square inch. When the dividers and upper and lower pads are in place in the container 10, each cell 14 is completely enclosed by a Faraday cage.

The conductive inner layer 26 is formed by mixing a sufficient quantity of carbon particles into a paper slurry during the paper forming process to create a fiberboard having a surface resistivity of less than $10^5$ ohms per square inch. The carbon particles have a size, on the average, of about 27 nanometers. In order to achieve a sufficient density of particles so as to render the middle layer 26 conductive, a first quantity of carbon particles is mixed in with the paper slurry during the mixing process, and an experimental roll of carbon content paperboard is formed. By measuring the actual surface resistivity of the experimental roll with an ohm meter, relative to the known quantity of carbon particles that were mixed in with the slurry, the first quantity can be altered accordingly to arrive at a quantity which corresponds to a paperboard having the desired conductive surface resistivity.

Figure 4:
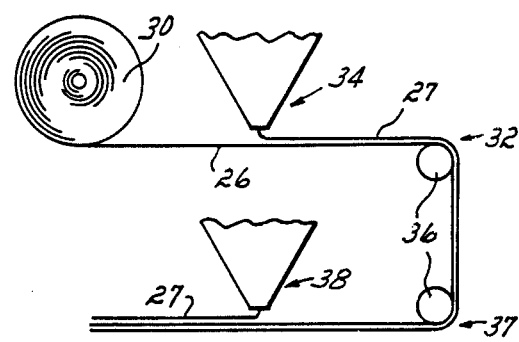
FIG. 4 is a diagrammatic illustration of a method of forming the paperboard of FIG. 3.

To form the exterior plies of the multiple-ply anti-static paperboard according to one embodiment of the invention, low-density, polyethylene doped with an anti-static additive is layered onto both sides of the high-carbon content paperboard 26. As shown in FIG. 4, a roll 30 of high-carbon paper-board 26 is unwound at a first level 32. At a first extruding station 34, the low-density molten polyethylene doped with a conventional anti-static agent is extruded onto a first side of the paperboard 26. The polyethylene solidifies shortly thereafter. Rollers 36 then direct the paperboard 26 to a second level 37 and below a second extruding station 38 in order to extrude a layer of the low-density, antistatic doped polyethylene onto a second side of the paperboard 26. Shortly thereafter, the multiple-ply anti-static paperboard of this invention is ready to be cut for use.

Any one of a number of different surfactants may be added to polyethylene to render the outer layers anti-static. In one preferred embodiment, an anti-static agent produced by the AMPACET Company and referred to as 10069 Antistatic Master Batch is mixed in sufficient quantity to provide a resulting outer layer having a surface resistivity of from $10^9$ to $10^{14}$ ohms per square inch.

Alternatively, as shown in FIG. 5, the outer anti-static layers 39 of the multiple-ply anti-static paperboard 25' can be formed of low-carbon paperboard. The carbon particles are mixed into the paper slurry during the paper making process. The desired quantity of carbon particles is arrived at in the same manner as described previously with respect to conductive layer 26, except that the quantity of carbon particles is varied to achieve a final surface resistivity of between $10^9$ and $10^{14}$ ohms per square inch. A slurry 1 between 10 is spilled out of a first box 41 to form one of the outer layers 39. The high-carbon layer 26 is spilled from a second box 42 in slurry form on top of the first formed outer layer 39. A slurry is subsequently spilled from a third box 43 out onto the exposed surface of the high-carbon paperboard 26 to form the other of the two outer layers 39.

Figure 7:
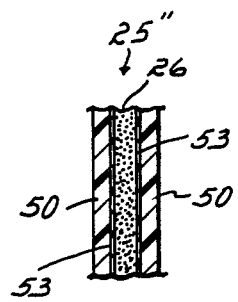
FIG. 7 is a cross-sectional view of a third alternative embodiment of the multiple-ply anti-static paperboard of this invention.

A third and currently preferred embodiment of the multiple-ply anti-static paperboard 25" is illustrated in FIG. 7. In this embodiment, precast anti-static plastic layers 50 are laminated onto the opposite sides of the high-carbon content, conductive paperboard 26. The preferred precast anti-static plastic layers 50 are layers of low-density, polyethylene film which have been chemically coated and then subjected to high-energy, electron-beam radiation so as to impart to the film a final surface resistivity of between $10^9$ and $10^{14}$ ohms per square inch. One preferred precast, polyethylene film having this anti-static surface resistivity is manufactured by MPI Metallized Products, Inc. of Winchester, Massachusetts and is identified by that company as its 'Staticure' product. This 'Staticure' product is particularly advantageous for use in this application because it is a permanently static dissipative plastic film, i.e., it does not lose its static dissipative quality or change its surface resistivity over prolonged periods of time.

Figure 8:
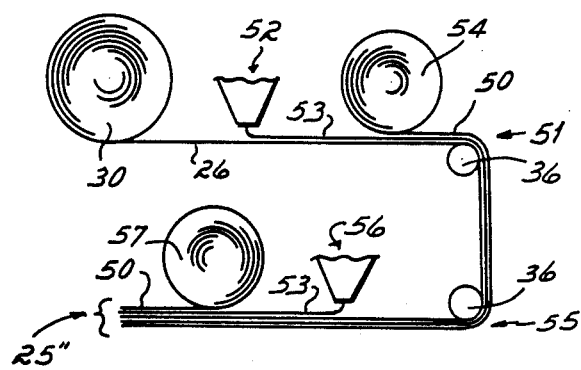
FIG. 8 is a schematic illustration of a method of forming the paperboard of FIG. 7.

With reference to FIG. 8, there is illustrated schematically the manner in which the paperboard product 25" of FIG. 7 is manufactured. As there illustrated, a roll 30 of high-carbon paperboard 26 is unwound at a first level 51. At a first extruding station 52, a thin film 53 of low-density, molten, polyethylene is extruded onto the top side of the paperboard 26. Before the polyethylene film solidifies, a first ply of the precast anti-static plastic film 50 is unwound from a roll 54 and applied over the top surface of the molten polyethylene film 53. Rollers 36 then direct the paperboard 26, having one ply of precast anti-static plastic film 50 applied thereto, to a second level 55. As the paperboard 26 moves along the second level 55, the paperboard 26 passes beneath a second extruding station 56 at which a second thin film 53 of molten, low-density polyethylene is applied to the now top surface (formerly the undersurface) of the paperboard 26. While this second film 53 of molten polyethylene is still in the molten state, a second ply 50 of precast anti-static plastic film is unrolled from a roll 57 onto the top surface of the molten polyethylene film 53. When the polyethylene films 53 are solidified, they secure the top and bottom plies or laminates 50 to the high-carbon content paperboard 26 which is now sandwiched therebetween. The multiple-ply, anti-static paperboard 25" is now ready to be cut for use.

Thus, according to the invention, a conductive layer of paperboard 26 is sandwiched by layers of anti-static material, which anti-static material may be a precast anti-static plastic ply laminated onto the conductive layer of paperboard or a plastic ply, such as polyethylene doped with an anti-static agent extruded onto the conductive paperboard, or paperboard having carbon particles mixed therein to provide a surface resistivity of from $10^9$ to $10^{14}$ ohms per square inch layered onto the conductive paperboard. The inner conductive layer 26 provides a Faraday cage to form a static shield about the packaged article, thereby protecting the article from electrostatic discharge. The anti-static layer adjacent the article prevents sloughing of the conductive material onto the article, which would otherwise cause circuit damage, and prevents generation of static electricity resulting from insulation or electric movement of the protected articles and the packaging paperboard. In the first and third embodiments, the extruded antistatic plastic film or the laminated anti-static plastic film physically blocks conductive particles from the packaged article. In the second embodiment, that which utilizes a low-carbon content paperboard outer layer, the size and density of the incorporated carbon particles is such that even dust particles will be electrically neutral, or anti-static. Thus, even if these particles should contact the packaged article, no damage would occur. In both instances, relative movement between the packaged article and the anti-static layers does not generate harmful static electricity.

The multiple-ply anti-static paperboard also provides sufficient rigidity to physically protect packaged articles. This physical protection is achieved with a savings in material and labor, as compared to packaging requiring a bag. As compared to a corrugated fiberboard, the multiple-ply anti-static paperboard of this invention is less expensive, denser, is easier to cut, and cuts more cleanly.

Lastly, with each embodiment, the multiple-ply anti-static paperboard of this invention can be made to provide chemical protection for a packaged article. For example, a corrosion inhibitor commonly referred to as Cobra Tech, manufactured by PMC Specialty and formerly made by Sherwin Williams, may be mixed into the outer layers prior to application to interior layer 26 in order to protect copper or copper alloyed articles. This substance dissipates off the outer layer to attach itself to the copper or copper alloy, thereby shielding the article from sulfuric compounds in the paper. Similarly, other corrosion inhibitors could be used with other types of articles, depending upon the metal that is required to be protected. Because the low-density anti-static polyethylene layers of the preferred embodiment are chemically inert, they will physically shield the packaged article from chemical corrosion. Thus, the addition of a corrosion inhibitor for this embodiment would not be necessary, but would provide added protection against chemical corrosion.

While I have described only three preferred embodiments of the multiple-ply anti-static paperboard of this invention, it is to be understood that the invention is not limited thereby and that in light of the present disclosure of the invention, various other alternative embodiments will be apparent to a person skilled in the art. Accordingly, it is to be understood that changes may be made without departing from the scope of the invention as particularly set forth and claimed.

I claim:

1. A container for use with an article which can be damaged by static electricity, comprising:
   a box having sidewalls and top and bottom walls;
   a plurality of relatively rigid dividers located in said box, each said divider comprising a layer of electrically conductive material sandwiched between and contacting two layers of an anti-static material, said electrically conductive material having a surface resistivity of less than $10^5$ ohms per square inch and said two layers of anti-static material having a surface resistivity of between $10^9$ and $10^{14}$ ohms per square inch; and
   wherein said dividers partially define a predetermined number of cells within said box, each said cell providing protection from both electrostatic discharge and conductive spall for a static electricity sensitive article to be packaged therein.

2. A container as in claim 1 and further comprising:
   a relatively rigid top pad located between said top wall of said box and said dividers;
   a relatively rigid bottom pad located between said bottom wall of said box and said dividers;
   wherein each said pad comprises a layer of electrically conductive material sandwiched between two layers of an anti-static material; and
   said pads and said dividers completely surrounding said cells with a layer of electrically conductive material sandwiched between two layers of anti-static material.

3. A container as in claim 1 wherein said electrically conductive material comprises:
   a high-carbon content paperboard.

4. A container as in claim 1 wherein said anti-static material comprises:
   a plastic doped with an anti-static agent.

5. A container as in claim 1 wherein said anti-static material comprises:
   an anti-static plastic material.

6. A container as in claim 5 wherein said anti-static plastic material comprises low-density polyethylene.

7. A container as in claim 5 wherein said plastic material comprises a plastic which has been subjected to electron-beam radiation to impart said surface resistivity of between $10^9$ and $10^{14}$ ohms per square inch.

8. A container as in claim 1 wherein said anti-static material comprises:
   low-carbon content paperboard.

9. A container for use with an article which can be damaged by static electricity, comprising:
   a box having sidewalls and top and bottom walls;
   a plurality of relatively rigid dividers located in said box, each said divider comprising a layer of high-carbon content paperboard sandwiched between and contacting two layers of an anti-static material, said high-carbon content paperboard having a surface resistivity of less than $10^5$ ohms per square inch and said two layers of anti-static material having a surface resistivity of between $10^9$ and $10^{14}$ ohms per square inch; and wherein said dividers partially define a predetermined number of cells within said box, each said cell providing protection from both electrostatic discharge and conductive spall for a static electricity sensitive article to be packaged therein.

10. A container as in claim 9 and further comprising:
a relatively rigid bottom pad located between said bottom wall of said box and said dividers;
a relatively rigid top pad located between said top wall of said box and said dividers;
wherein each said pad comprises a layer of high-carbon content paperboard sandwiched between two layers of an anti-static material; and
said pads and said dividers completely surrounding said cells with a layer of high-carbon content paperboard sandwiched between two layers of anti-static material.

11. A multiple-ply material comprising:
a first layer of anti-static material;
a second layer of anti-static material;
a third layer of relatively rigid, electrically conductive material sandwiched between and contacting said first and second layers; and
wherein said first and second layers have a surface resistivity of between $10^9$ and $10^{14}$ ohms per square inch and said third layer has a surface resistivity of less than $10^5$ ohms per square inch.

12. A multiple-ply material as in claim 11 wherein said electrically conductive material comprises:
a high-carbon content paperboard.

13. A multiple-ply material as in claim 11 wherein said anti-static material comprises:
a plastic doped with an anti-static agent.

14. A multiple-ply material as in claim 11 wherein said anti-static material comprises:
an anti-static plastic material.

15. A multiple-ply material as in claim 14 wherein said anti-static material comprises:
low-density polyethylene.

16. A multiple-ply material as in claim 14 wherein said plastic material comprises:
plastic which has been subjected to high-energy, electron-beam radiation.

17. A multiple-ply material as in claim 11 wherein said anti-static material comprises:
a low-carbon content paperboard.

18. A multiple-ply material as in claim 11 wherein said anti-static material further comprises:
a corrosion inhibitor.

19. A method of manufacturing the multiple-ply anti-static material of claim 11 comprising the steps of:
forming a relatively rigid interior ply of electrically conductive material, said interior ply having first and second surfaces and a surface resistivity of less than $10^5$ ohms per square inch;
forming a first outer ply of low-carbon content paperboard on said first surface of said interior ply; and
forming a second outer ply of low-carbon content paperboard on said second surface of said interior ply, said first and second outer plies having a surface resistivity of between $10^9$ and $10^{14}$ ohms per square inch, thereby to provide a relatively rigid electrically conductive material sandwiched between two low-carbon content outer plies.

20. A method of manufacturing the multiple-ply anti-static material as in claim 19 wherein said electrically conductive material comprises a high-carbon content paperboard.

21. A multiple-ply paperboard comprising:
a first layer of anti-static material;
a second layer of anti-static material;
a third layer of high-carbon content paperboard sandwiched between and contacting said first and second layers; and
wherein said first and second layers have a surface resistivity of between $10^9$ and $10^{14}$ ohms per square inch and said third layer of high-carbon content paperboard has a surface resistivity of less than $10^5$ ohms per square inch.

* * * * *

UNITED STATES PATENT AND TRADEMARK OFFICE
CERTIFICATE OF CORRECTION

PATENT NO. : 4,966,280
DATED : October 30, 1990
INVENTOR(S) : Judson A. Bradford It is certified that error appears in the above-identified patent and that said Letters Patent is hereby corrected as shown below:

Col. 6, line 11, change "antistatic" to read as --anti-static--.

Col. 6, line 32, change "A slurry 1 between 10 is" to read as --A slurry is--.

Col. 6, line 54, change "'Staticure'" to read as --"Staticure"-- (both occurrences).

Col. 7, line 35, change "antistatic" to read as --anti-static--.

Signed and Sealed this

Eighteenth Day of August, 1992

Attest:

DOUGLAS B. COMER

*Attesting Officer*   *Acting Commissioner of Patents and Trademarks*

REEXAMINATION CERTIFICATE (3162nd)
United States Patent [19]
Bradford

[11] B1 4,966,280

[45] Certificate Issued Mar. 25, 1997

[54] MULTIPLE-PLY ANTI-STATIC PAPERBOARD

[75] Inventor: Judson A. Bradford, Holland, Mich.

[73] Assignee: Bradford Company, Holland, Mich.

Reexamination Request:
No. 90/003,961, Sep. 13, 1995

Reexamination Certificate for:
Patent No.: 4,966,280
Issued: Oct. 30, 1990
Appl. No.: 336,733
Filed: Apr. 12, 1989

Certificate of Correction issued Aug. 18, 1992.

[51] Int. Cl.$^6$ .................................................. B65D 81/00
[52] U.S. Cl. ........................ 206/721; 493/906; 53/170
[58] Field of Search ...................... 206/701, 706,
206/709, 719; 162/125, 128, 138, 158,
168.1, 168.2; 428/924, 931, 35.7, 34.2,
80, 500, 512, 514, 522, 323

[56] References Cited

U.S. PATENT DOCUMENTS

| | | | |
|---|---|---|---|
| 4,293,070 | 10/1981 | Ohlbach . | |
| 4,308,953 | 1/1982 | Cohen . | |
| 4,309,486 | 1/1982 | Sack et al. | 428/511 |
| 4,427,114 | 1/1984 | Howell et al. | 206/328 |
| 4,455,350 | 6/1984 | Berbeco | 428/322.2 |
| 4,480,001 | 10/1984 | Cannady, Jr. et al. | 428/284 |
| 4,529,087 | 7/1985 | Neal et al. . | |
| 4,540,624 | 9/1985 | Cannady, Jr. | 428/282 |
| 4,606,790 | 8/1986 | Youngs et al. . | |
| 4,711,702 | 12/1987 | Hood . | |
| 4,767,003 | 8/1988 | Rice et al. | 206/328 |
| 4,823,945 | 4/1989 | Adelman | 206/204 |
| 4,882,894 | 11/1989 | Havens et al. | 53/461 |
| 4,889,750 | 12/1989 | Wiley | 428/34.2 |
| 4,906,494 | 3/1990 | Babinec et al. | 428/35.2 |
| 4,909,901 | 3/1990 | McAllister et al. | 162/125 |
| 5,041,319 | 8/1991 | Becker et al. | 428/71 |
| 5,064,699 | 11/1991 | Havens et al. | 428/35.7 |

FOREIGN PATENT DOCUMENTS

| | | | |
|---|---|---|---|
| 1087083 | 10/1980 | Canada | 154/105.1 |

*Primary Examiner*—Jacob K. Ackun, Jr.

[57] ABSTRACT

A multiple-ply anti-static paperboard having a layer of high-carbon content fiberboard sandwiched between two plies of anti-static material, the anti-static material being an anti-static plastic or low-carbon content paperboard. Dividers and pads made of such multiple-ply paperboard are used to form a plurality of walled cells within a container, each of the cells completely enclosing a packaged article susceptible to electrostatic discharge. The conductive layer forms a Faraday cage to electrostatically shield the packaged article, and the anti-static layer prevents conductive dust from contacting and adversely affecting the packaged article, as well as protecting the packaged article against the generation of static electricity internally of the container.

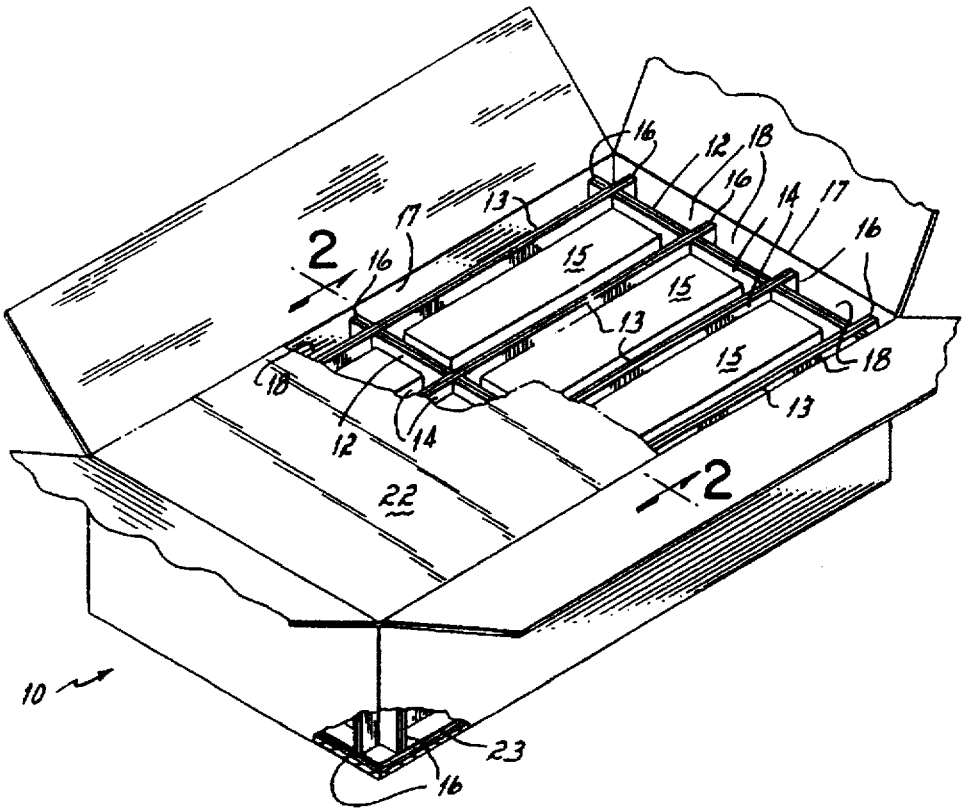

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–21 is confirmed.

* * * * *